(12) United States Patent
Pincek et al.

(10) Patent No.: US 8,695,823 B2
(45) Date of Patent: Apr. 15, 2014

(54) POWER SUPPLY SUPPORT SYSTEM

(75) Inventors: David Pincek, Huntington Beach, CA (US); Carlo Espiritu, Orange, CA (US); Jeff Hatley, Mebane, NC (US); Nerio Perez, Torrance, CA (US); Stanley S Coe, Raleigh, NC (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 13/540,533

(22) Filed: Jul. 2, 2012

(65) Prior Publication Data

US 2012/0267364 A1 Oct. 25, 2012

Related U.S. Application Data

(63) Continuation of application No. 11/888,346, filed on Jul. 31, 2007, now Pat. No. 8,220,652.

(51) Int. Cl.
*B65D 8/18* (2006.01)

(52) U.S. Cl.
USPC ............ 220/4.02; 220/3.2; 220/3.9; 220/737; 220/743; 206/701; 248/218.4; 248/311.2; 312/223.1

(58) Field of Classification Search
USPC ......... 220/3.2, 3.94, 4.02, 737, 743; 206/701; 312/223.1; 248/218.4, 311.2
See application file for complete search history.

(56) References Cited

U.S. PATENT DOCUMENTS

| | | | | |
|---|---|---|---|---|
| 4,406,928 | A | * | 9/1983 | MacKenzie .................... 379/454 |
| 5,850,440 | A | * | 12/1998 | Hannon et al. ................. 379/446 |
| 5,979,724 | A | * | 11/1999 | Loewenthal et al. .......... 224/483 |
| 2006/0168925 | A1 | * | 8/2006 | Whittemore .................... 55/490 |
| 2006/0231707 | A1 | * | 10/2006 | Schrot ......................... 248/218.4 |
| 2007/0046258 | A1 | * | 3/2007 | Defant et al. .................. 320/115 |

* cited by examiner

*Primary Examiner* — Anthony Stashick
*Assistant Examiner* — Elizabeth Volz
(74) *Attorney, Agent, or Firm* — The Hecker Law Group, PLC

(57) ABSTRACT

An external power supply housing configured for multiple mounting options. In one or more embodiments, the housing of the invention comprises channels configured to accept straps for mounting said housing to a support structure by means of those straps. In one or more embodiments, the housing of the invention comprises threaded inserts configured to mount said housing to a support structure by means of threaded fasteners. In one or more embodiments, the housing of the invention comprises a snap engagement portion configured to snap engage a mating power supply caddy for mounting the housing to the caddy.

7 Claims, 6 Drawing Sheets

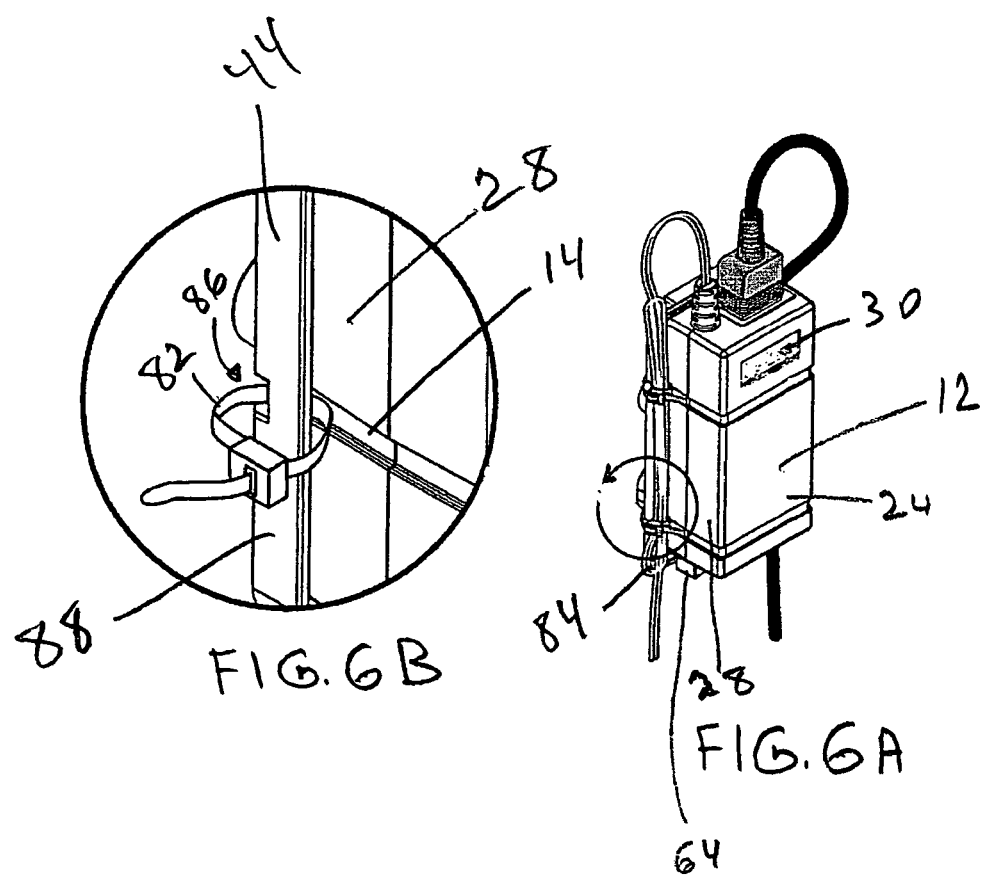

POWER SUPPLY SUPPORT SYSTEM

CROSS-REFERENCE TO RELATED APPLICATIONS

This application is continuation of U.S. patent application Ser. No. 11/888,346 filed Jul. 31, 2007, which is incorporated by reference herein.

FIELD OF THE INVENTION

The present invention relates to equipment support systems. More specifically, the invention relates to an external power supply support system and method.

BACKGROUND

External power supplies have traditionally been fastened to support structures using Velcro®-type straps or double-sided tape. These types of fasteners, however, become unreliable over extended periods of time as heat emanated from the power supply during operation tends to weaken the adhesive or gripping power of the fasteners. The end result is inevitably an external power supply hanging from its own power cables. This may result in accidental or undesirable interruption in the operation of electronic equipment being powered by conventionally mounted external power supplies. Such unwarranted interruption may result in loss of valuable data and/or embarrassment to the user during a presentation before an audience.

Moreover, traditional means to mount external power supplies do not provide mounting capability to all types of support structures, such as inside a podium. The need exists, therefore, to mount an external power supply in a more secure and reliable manner to a variety of support structures so as to avoid any interruption in the operation of equipment powered by the external supply.

SUMMARY OF THE INVENTION

Some embodiments disclosed herein are generally directed to a power supply support system. In accordance with one aspect of the present invention, the power supply support system comprises a caddy configured for secure mounting to at least one support surface, and a power supply enclosure releasably engaged by the securely mounted caddy.

In accordance with another aspect of the present invention, the power supply support system comprises an enclosure for an external power supply. The power supply enclosure includes at least one indentation spanning its top and side surfaces in a substantially horizontal fashion.

The power supply support system also comprises a caddy with a shell-like body configured to engage at least a portion of the power supply enclosure. The shell-like body of the caddy is provided with a plurality of mounting apertures spaced according to standard rack rail aperture spacing. The mounting apertures emanate from a series of integral structures bulging from the bottom surface of the shell-like body. The bulging aperture structures in combination with a plurality of integral structural ribs are configured collectively to provide a substantially flat and elevated interface suitable for mounting the caddy to a support surface.

Other embodiments disclosed herein are generally directed to a power supply support method. In accordance with one aspect of the present invention, the power supply support method comprises the steps of:

providing an enclosure for an external power supply;

indenting the external power supply enclosure across its top and side surfaces in a substantially horizontal fashion;

configuring a caddy to releasably engage at least a portion of the indented power supply enclosure;

providing the caddy with a plurality of mounting aperture structures spaced according to standard rack rail aperture spacing; and utilizing the mounting aperture structures to provide a substantially flat and elevated interface suitable for mounting the caddy to a support surface.

These and other aspects of the invention will become apparent from a review of the accompanying drawings and the following detailed description of the invention.

BRIEF DESCRIPTION OF THE DRAWINGS

The present invention is generally shown by way of reference to the accompanying drawings in which:

FIG. 6A is a perspective view of a cable strain relief assembly for use with the external power supply support system of FIG. 1A; and FIG. 6B is an enlarged fragmentary view of the cable strain relief assembly of FIG. 6A.

DETAILED DESCRIPTION OF THE INVENTION

The detailed description set forth below in connection with the appended drawings is intended as a description of illustrated exemplary embodiments and is not intended to represent the only forms in which these embodiments may be constructed and/or utilized. The description sets forth the functions and sequence of steps for constructing and operating the present invention in connection with the illustrated embodiments. However, it is to be understood that the same or equivalent functions and/or sequences may be accomplished by different embodiments that are also intended to be encompassed within the spirit and scope of the present invention.

Some embodiments of the present invention will be described in detail with reference to an external power supply support system and method, as generally depicted in reference to FIGS. 1-6B. Additional embodiments, features and/or advantages of the invention will become apparent from the ensuing description or may be learned by practicing the invention. In the attached figures, the various drawings are not to scale with like numerals referring to like features throughout both the drawings and the description.

FIG. 1A is a perspective view of an external power supply support system 10 in accordance with one embodiment of the present invention. Support system 10 includes a generally box-like enclosure 12 for an external power supply which may be used to power various electronic components. For example, enclosure 12 may be configured to house a 9V, 12V or 15V external power supply, as needed. Power supply enclosure 12 may be made of plastic and/or other suitable material(s).

Figure 3:
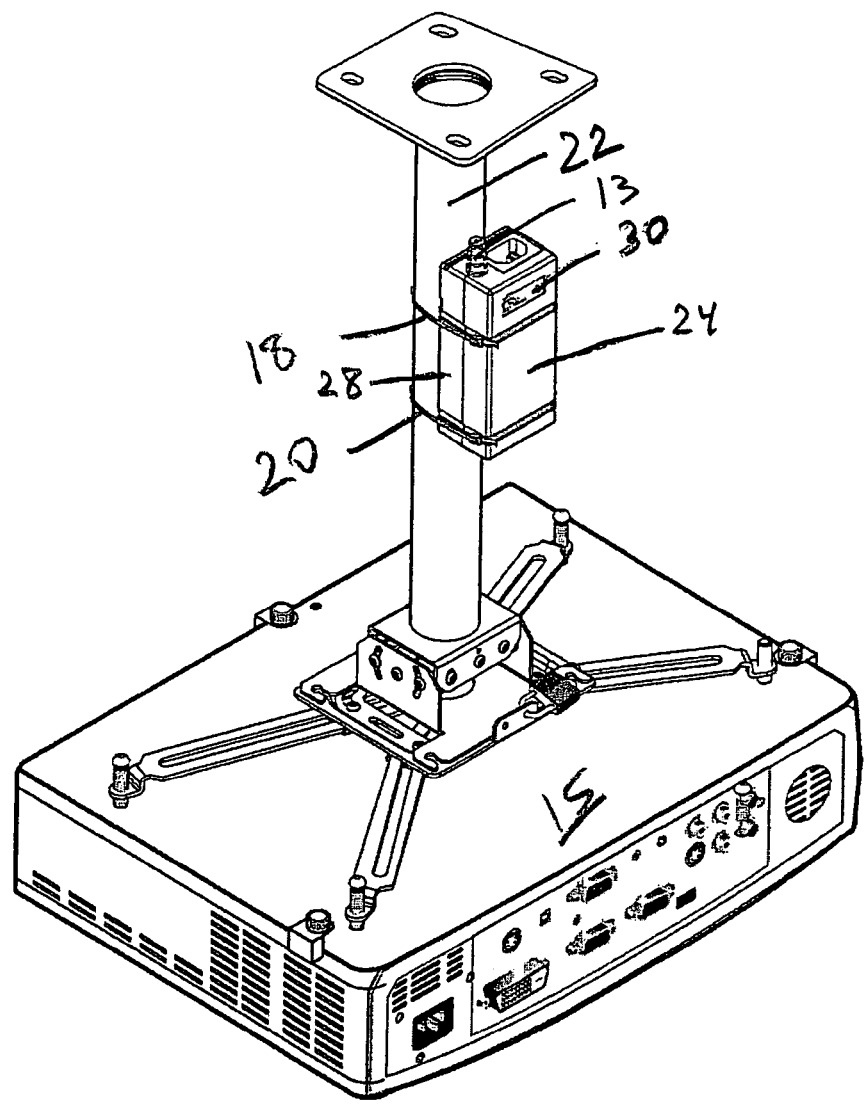
FIG. 3 is a perspective view a pole-mountable enclosure for an external power supply in accordance with another embodiment of the present invention.

In one embodiment, external power supply enclosure 12 is provided with two generally parallel channels or indentations 14, 16 (FIGS. 1A-1B, 1F-1G) which accommodate straps 18, 20 for securely fastening enclosure 12 to an elongated member 22, as generally illustrated in reference to FIG. 3. Elongated member 22 may be a pole, a table leg, a stand leg or any other suitable support structure. In this case, secured enclosure 12 houses an external power supply 13. Pole 22 may be coupled to the underside of an electronic device 15 (FIG. 3). Straps 18, 20 may be configured as plastic zip ties, tie wraps or any other suitable fastener, as needed.

Indentations 14, 16 span the top and side surfaces 24, 26 and 28, respectively, of power supply enclosure 12 in a generally horizontal fashion, as generally illustrated in reference to FIGS. 1A-1B, 1F-1G, 3. Indentations 14, 16 are strategically spaced apart to allow secure fastening of the top and bottom portions of enclosure 12 to pole 22. Other indentation configurations may be utilized, as desired, provided there is no departure from the intended scope of the present invention. For example, external power supply enclosure 12 may be provided with more than two strap channels or with just one centrally disposed channel. Top surface 24 of power supply enclosure 12 may also include a portion 30 which is suitable for application of logo or other insignia, as generally shown in reference to FIGS. 1A, 1F, 2-3, 6A.

Figure 1:
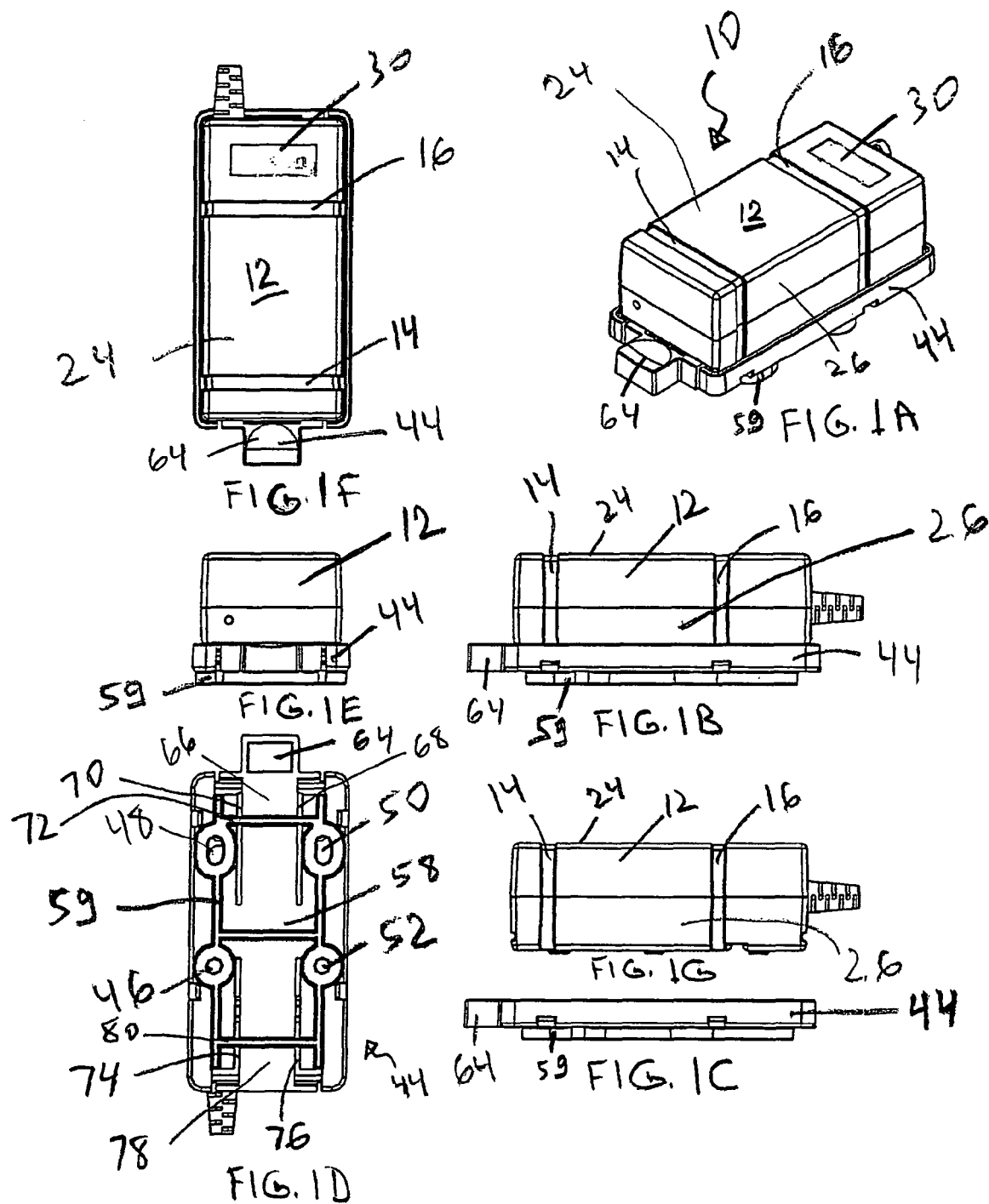
FIG. 1A is a perspective view of an external power supply support system in accordance with one embodiment of the present invention.
FIG. 1B is a side elevation of the external power supply support system of FIG. 1A.
FIG. 1C is a side elevation of one component of the external power supply support system of FIG. 1A.
FIG. 1D is a bottom elevation of the external power supply support system of FIG. 1A.
FIG. 1E is a front elevation of the external power supply support system of FIG. 1A.
FIG. 1F is a top elevation of the external power supply support system of FIG. 1A.
FIG. 1G is a side elevation of another component of the external power supply support system of FIG. 1A.
Figure 2:
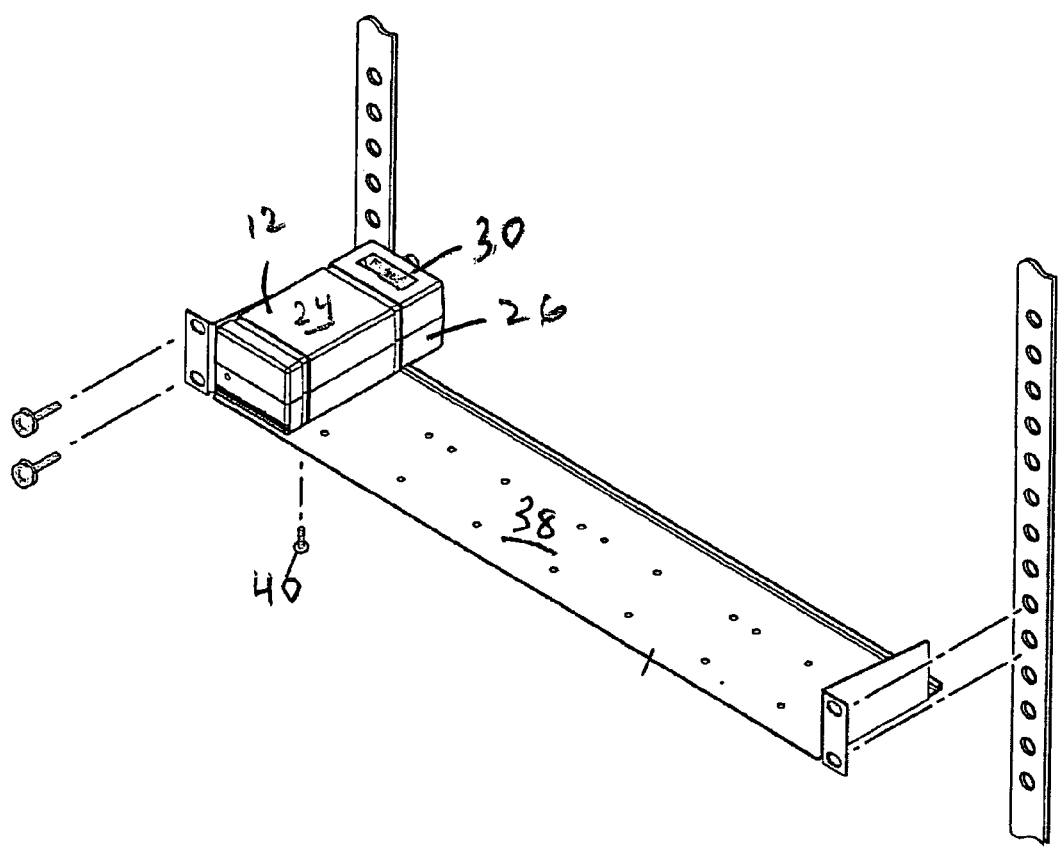
FIG. 2 is a perspective view a rack-mountable enclosure for an external power supply in accordance with one embodiment of the present invention.
Figure 4:
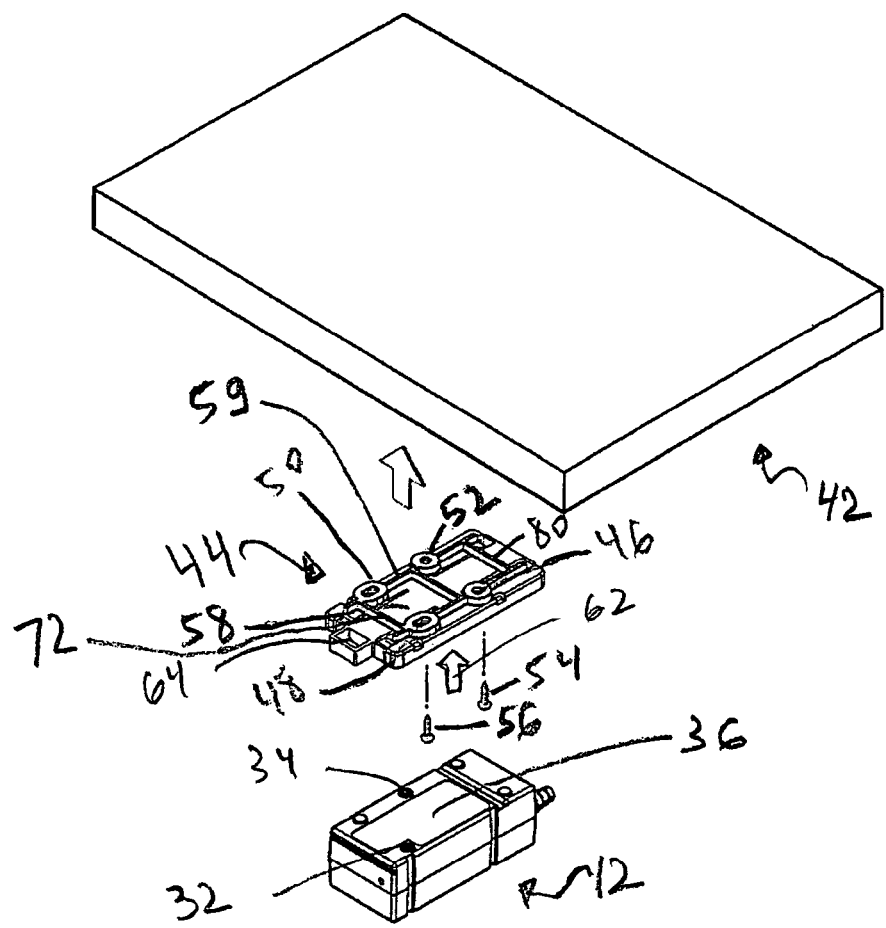
FIG. 4 is an exploded perspective view of a surface-mountable support system for an external power supply in accordance with one embodiment of the present invention.

In another embodiment, external power supply enclosure 12 is provided with two female-threaded metal inserts 32, 34 which are embedded in a bottom portion 36 of power supply enclosure 12, as generally depicted in reference to FIG. 4. Metal inserts 32, 34 (FIG. 4) may be used to securely mount power supply enclosure 12 directly to a rack shelf 38 via male-threaded fasteners, such as screw 40, as generally shown in FIG. 2. The number of embedded inserts may be varied, as needed. Embedded inserts 32, 34 (FIG. 4) may be manufactured of any suitable material or combination of materials.

In yet another embodiment, enclosure 12 may be securely mounted to a support surface 42 via an appropriately configured power supply caddy 44, as generally illustrated in reference to FIG. 4. Particularly, power supply caddy 44 is provided with a plurality of apertures 46, 48, 50, 52 (FIGS. 1D, 4) to accommodate fasteners (such as screws, bolts or the like) 54, 56 (FIG. 4) which are used to mount caddy 44 to support surface 42. A person skilled in the art would appreciate that the number of apertures and/or fasteners used may be varied, as needed. Power supply caddy 44 may be made of plastic and/or other suitable material(s).

Apertures 46, 48, 50, 52 emanate from a series of respective symmetrically spaced integral structures bulging from bottom surface 58 of caddy 44. Bulging aperture structures in combination with a plurality of integral structural ribs are configured collectively to provide a generally flat and elevated interface 59 (FIGS. 1A-1E, 4) suitable for mounting caddy 44 to support surface 42 (FIG. 4). Other aperture configurations may be used in accordance with the general principles of the present invention. In one embodiment, caddy apertures 46, 48, 50, 52 are spaced according to standard rack rail aperture spacing to allow problem-free mounting of caddy 44 to rear rack rail 45 via one or more fasteners (screws, bolts or the like), such as fastener 47, as generally illustrated in reference to FIG. 5. This setup would be convenient whenever there is no room in the front to accommodate a rack shelf for mounting power supply enclosure 12.

Top portion 60 (FIG. 5) of power supply caddy 44 has a shell-like configuration adapted to frictionally engage bottom portion 36 of enclosure 12, as generally shown by directional arrow 62 in FIG. 4. In one embodiment, bottom portion 36 of enclosure 12 is securely retained within shell-like top portion 60 (FIG. 5) of power supply caddy 44 via snap action. In this case, power supply caddy 44 would have already been securely mounted to surface 42 via fasteners 54, 56 (FIG. 4). Power supply enclosure 12 may be disengaged from shell-like top portion 60 (FIG. 5) of caddy 44 by the user pressing down (away from retained bottom portion 36 of enclosure 12) on integral caddy tab 64 (FIG. 4). Tab 64 has a generally tongue-like body 66 which is disposed between apertures 48, 50 and separated on each side from the rest of the shell-like structure of top caddy portion 60 by symmetrically spaced cutouts 68, 70, as generally depicted in reference to FIG. 1D. Tongue-like tab 64 is adapted to flex away from bottom portion 36 of enclosure 12 via an integral crosswise structural rib 72 (FIGS. 1D, 4). In this regard, tab 64 is advantageously disposed at higher elevation than aperture interface 59 (FIGS. 1A-1E, 4) to allow sufficient flexing clearance when power supply caddy 44 is mounted to support surface 42 (FIG. 4). Crosswise structural rib 72 is part of aperture interface 59 (FIG. 1D).

Figure 5:
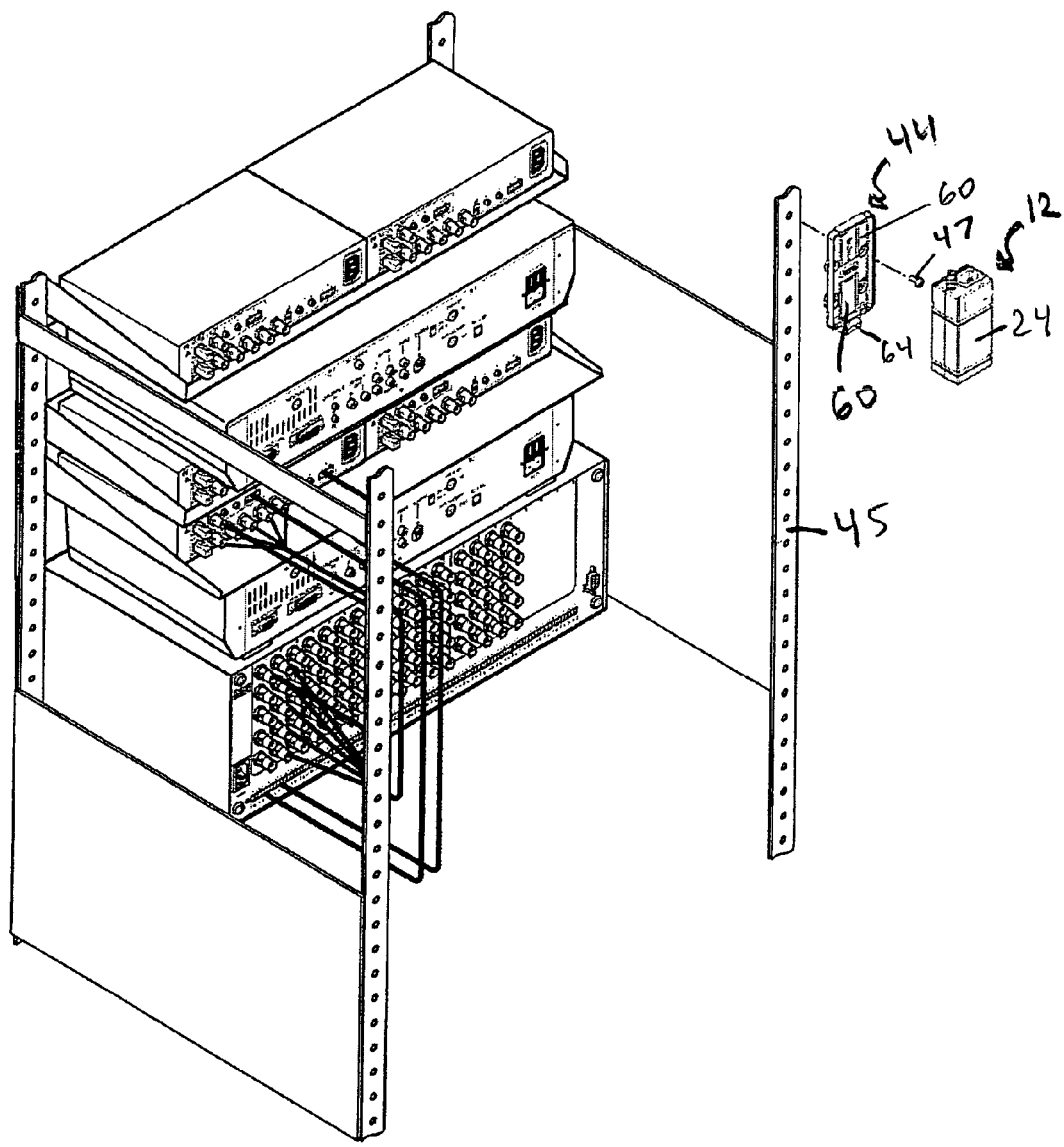
FIG. 5 is an exploded perspective view of a rack-mountable support system for an external power supply in accordance with another embodiment of the present invention.

On the opposite side, another pair of symmetrically spaced cutouts 74, 76 outline a generally T-shaped integral member 78 of shell-like top portion 60 (FIG. 5) of caddy 44. T-shaped member 78 is configured to flex on a respective integral crosswise structural rib 80 (FIGS. 1D, 4). Crosswise structural rib 80 is substantially parallel to crosswise structural rib 72, as generally depicted in reference to FIGS. 1D and 4. Crosswise structural rib 80 is also part of aperture interface 59 (FIG. 1D). T-shaped member 78 facilitates disengagement of power supply enclosure 12 from caddy 44 by flexing, as needed, when tab 64 is pressed down by the user. Tab 64 and T-shaped member 78 also facilitate engagement of bottom portion 36 of power supply enclosure 12 by flexing accordingly as bottom enclosure portion 36 snaps into shell-like top caddy portion 60 (FIG. 5).

With power supply enclosure 12 securely snapped into shell-like top portion 60 of caddy 44, the user may utilize tie wrap or zip tie 82 (FIG. 6B) or other suitable strapping, as needed, to secure power supply cabling 84 (FIG. 6A) to one side of caddy 44 through one or more integral cutouts, such as cutout 86 in FIG. 6B, on an outer edge 88 of caddy 44. Cabling 84 may include AC and DC power cables from the external power supply housed in enclosure 12. Each outer edge cutout on caddy 44 is configured to line up with a corresponding surface indentation on enclosure 12. In this regard, FIG. 6B depicts cutout 86 generally coinciding with enclosure indentation 14 to allow the threading of zip tie 82. A person skilled in the art would readily recognize that the present invention provides a multifunctional, interchangeably-mountable power supply support system. Particularly, the provision of caddy 44 for external power supply enclosure 12 allows easy and reliable mounting of the power supply to surfaces where there would normally be no other reliable means of mounting. The conventional use of Velcro®-type straps or double-sided tape (which become unreliable over extended periods of time) as mounting means is advantageously avoided. The external power supply support system of the present invention may be easily mounted inside a podium or to any other structure, as needed.

In one exemplary embodiment, external power supply enclosure 12 is configured as a rack-mountable unit of 1 U height and ⅛ rack width. "U" is a standard unit of measure for designating vertical usable space such as height of racks. This unit of measurement refers to the space between shelves on a rack. 1 U equals 1.75 inches. Other suitable power supply enclosure configurations may be employed, as desired.

A person skilled in the art would also recognize that the various embodiments described hereinabove are merely illustrative of the general principles of the present invention. Various design or system modifications may be utilized as long as such modifications reside within the scope of the invention. For example, the power supply caddy of the present invention may be readily modified for use with a variety of other equipment. Thus, by way of example, but not of limitation, various alternative configurations may be utilized in accordance with the teachings herein. Accordingly, the drawings and description are illustrative and not meant to be a limitation thereof.

Moreover, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Thus, it is intended that the invention cover all embodiments and variations thereof as long as such embodiments and variations come within the scope of the appended claims and their equivalents.

What is claimed is:

1. A power supply housing configured for multiple mounting options comprising:
    at least one external channel formed along an exterior surface of said power supply housing configured for accepting a strap for mounting said housing to a support structure by means of said strap;
    a first snap engagement portion configured to snap engage a mating second snap engagement portion of a power supply caddy for mounting said housing to said caddy;
    at least one threaded insert configured for mounting said housing to a support structure by means of a threaded fastener.

2. The power supply housing of claim 1 further comprising a tab configured to facilitate disengagement of said first snap engagement portion of said power supply housing from said second snap engagement portion said power supply caddy.

3. The power supply housing of claim 1 wherein said at least one threaded fastener comprises a screw.

4. The power supply housing of claim 1 wherein a strap for mounting to said housing comprises a cable tie.

5. The power supply housing of claim 1 wherein said power supply housing is configured to frictionally engage said mating power supply caddy.

6. The power supply housing of claim 1 wherein said at least one external channel comprises at least two channels.

7. The power supply housing of claim 6 wherein said at least two channels comprise two channels parallel to each other.

* * * * *